United States Patent [19]

Doi et al.

[11] Patent Number: 4,480,013
[45] Date of Patent: Oct. 30, 1984

[54] SUBSTRATE FOR USE IN SEMICONDUCTOR APPARATUS

[75] Inventors: Yoshihiko Doi; Nobuo Ogasa; Akira Ohtsuka; Tadashi Igarashi, all of Hyogo, Japan

[73] Assignee: Sumitomo Electric Industries, Ltd., Osaka, Japan

[21] Appl. No.: 398,871

[22] Filed: Jul. 14, 1982

[30] Foreign Application Priority Data

Jul. 20, 1981 [JP] Japan ............................ 56-113878

[51] Int. Cl.³ ............................................. C23C 17/00
[52] U.S. Cl. ................................... 428/616; 428/617; 428/618; 428/619; 428/621; 428/626; 428/650; 428/654
[58] Field of Search .............. 428/616, 617, 618, 619, 428/621, 626, 650, 654

[56] References Cited

U.S. PATENT DOCUMENTS 3,919,717 11/1975 Cullen et al. .................. 428/668
3,936,577 2/1976 Christini et al. ............... 428/668

OTHER PUBLICATIONS

K. Agnihotri et al., *Electronic Pkg. & Prod.*, pp. 179–185, Apr. 1981.
Koichi Nima et al., *Semiconductor International*, pp. 49–56, Apr. 1980.
*Kyocera Packaging*, Kyocera Ceramic Packages.

Primary Examiner—Veronica O'Keefe
Attorney, Agent, or Firm—Wenderoth, Lind & Ponack

[57] ABSTRACT

The invention relates to semiconductor chip mounting substrate for use in semiconductor apparatus, wherein metal material or multi-laminated metal material is coated on its surface and/or lateral faces with thin film of insulated inorganic matter in order to obtain an insulated substrate not only capable of efficiently radiating the heat developed in the semiconductor chip but also having thermal expansion coefficient approximate to that of the semiconductor chip, or further coated with film of Cu or Al so that the substrate is provided with high thermal conductivity and required thermal expansion characteristics thereby enabling to produce semiconductor apparatus highly effective for the acceleration of increase of density, reduction of size and improvement of radiation of IC.

9 Claims, 10 Drawing Figures

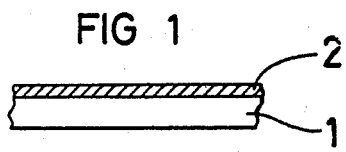
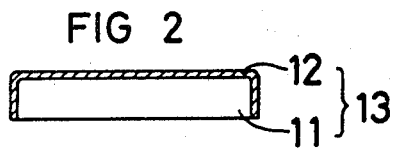
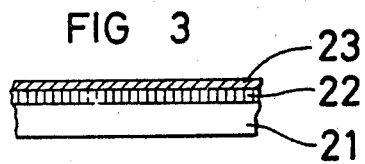
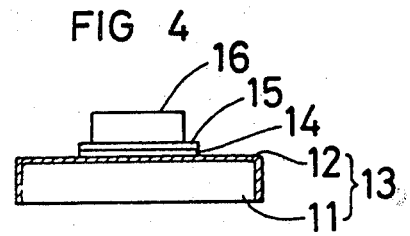
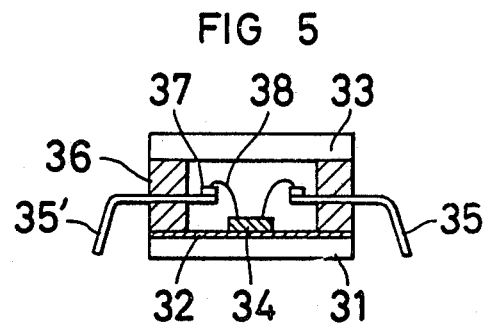
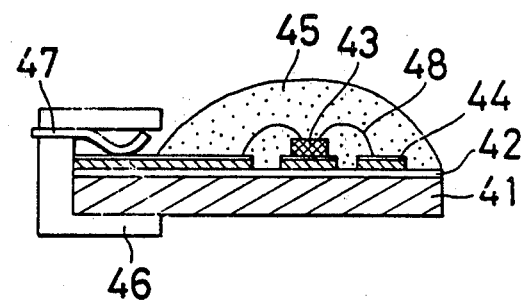
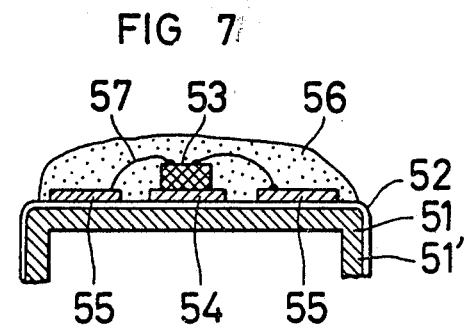

SUBSTRATE FOR USE IN SEMICONDUCTOR APPARATUS

The invention relates to semiconductor chip mounting substrate for use in integrated circuit apparatus, and the invention provides substrate material for use in semiconductor apparatus not only capable of efficiently radiating the heat developed in the semiconductor chip but also having the characteristics intrinsic to the substrate material, i.e., thermal expansion coefficient approximate to that of the chip and insulated properties.

When high reliability was required from integrated circuit, the packaging method comprising CerDIP, multi-laminated ceramic package, etc. was conventionally employed. In this case, the semiconductor chip was generally mounted on the ceramic substrate with interposition of metallizing layer or coating layer for bonding. The substrate was required to have not only the characteristics of hermetic sealing as part of the packaging material but also insulated properties and the characteristics of minimizing the mismatch between the thermal expansion coefficient of the substrate and that of the semiconductor chip. Conventionally, therefore, sintered ceramics, such as $Al_2O_3$, BeO, $2MgO.SiO_2$, etc. were extensively used.

With the recent trend toward higher density and greater size of the integrated circuit chip, the demand for substrate material capable of radiating the increased amount of heat generated by the semiconductor chip has been steadily on the increase. Thus, in case of the lead frame for use in resin-mold IC, the raw material is changing from Ni alloy to Cu alloy. The demand for improved radiation is strong also in respect of the integrated circuit of CerDIP and multi-laminated ceramic package. However, $Al_2O_3$ and $2MgO.SiO_2$ can hardly satisfy the demand since they have essentially poor thermal conductivity. BeO having high thermal conductivity is the only competent material. However, it has a disadvantage in that it is not only expensive but also poisonous. In case of $Al_2O_3$ which is most extensively in use, the misoperation of the integrated circuit caused by the irradiation damage of $\alpha$ rays to the semiconductor chip generated from U mixed during the pressing and sintering is now posing a serious problem particularly when there is an ever-increasing demand for higher performance and reliability of the integrated chip.

The tape carrier type IC packaging is now attracting attention in the IC packaging techniques in respect of continuation of the IC packaging and improvement of bonding speed. However, since organic matter, such as polyimide, is used as film for the substrate, the heat resistance and radiation are not sufficient thereby making it difficult to develop its use toward power IC which is in ever-increasing demand in recent years and to realize the greater density of part packaging. Thus the range of utility is limited.

FIG. 1 is a fragmentary sectional view showing the structure of the substrate film for use in tape carrier type IC packaging, Cu foil 2 being bonded onto polyimide film 1. The Cu foil formed into a circuit by the resist method is used as lead frame. This method, however, involves many problems in respect that adhesion between polyimide film and Cu foil is greatly deteriorated when exposed to a temperature above 150° C. for many hours, and that the polyimide film has poor thermal conductivity resulting in dispersion of heat generated by the heat treatment during the IC assemblage and the operation of IC.

Multi-laminated ceramic packaging method and CerDIP method have conventionally been used when high reliability is required from IC. Though the former in particular has high reliability, it has poor radiation. Since this disadvantage has to be counterbalanced by proving a heat sink and radiation plate, said method involves a problem in respect of high packaging cost.

The CerDIP comprising ceramics and glass is highly reliable though expensive. However, it is not suitable for package from which high radiation is required, since ceramics has poor thermal conductivity.

The most economical resin sealed package involves problem in respect of water permeability and leak at the interface between the resin and the lead frame. Moreover, the sealing resin has poor thermal conductivity. Thus, the resin sealed package is not capable of satisfying the high level demand.

The invention has for an object to provide semiconductor chip mounting substrate material of improved heat resistance, radiation and airtightness of replacing the conventional ceramic substrate, tape carrier type polyimide film substrate and the like by eliminating the aforedescribed defects thereof.

The substrate material according to the invention and the semiconductor apparatus in which said material is used will hereinunder be described in detail in reference to the accompanying drawings.

FIG. 1 is a fragmentary sectional view showing the conventional film-shaped substrate.

FIG. 2 is a fragmentary sectional view showing a flat plate-shaped substrate according to the invention.

FIG. 3 is a fragmentary sectional view showing a tape-shaped substrate according to the invention.

FIG. 4 is a sectional view showing an embodiment of the semiconductor apparatus making use of the flat plate-shaped substrate according to the invention.

FIG. 5 is a sectional view showing a second embodiment of the same.

FIG. 6 is a sectional view showing a third embodiment of the semiconductor apparatus making use of the tape-shaped substrate according to the invention.

FIG. 7 is a sectional view showing a fourth embodiment of the semiconductor apparatus making use of the flat plate-shaped substrate according to the invention.

Figure 8:
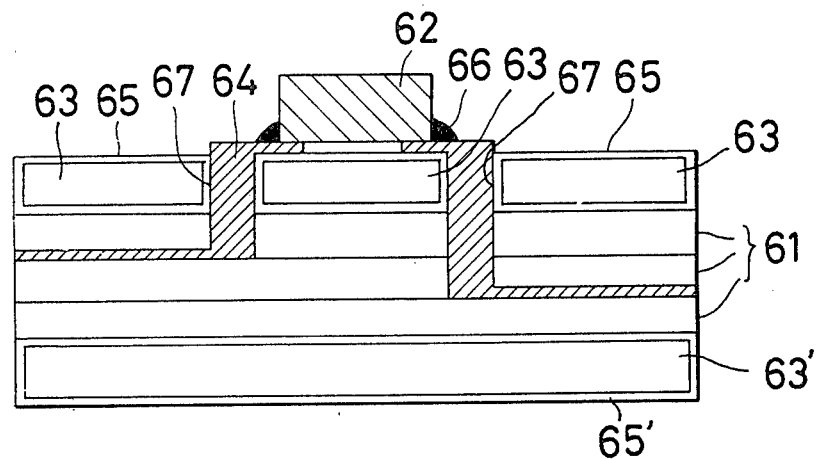
FIG. 8 is a sectional view showing a fifth embodiment of the same.

The semiconductor chip mounting substrate material according to the invention comprises a metal, alloy or compound tape thereof having a thermal expansion coefficient approximate to that of the chip in addition to high thermal conductivity, the surface of said metal, alloy or clad tape being coated by inorganic film having insulated properties, relatively good thermal conductivity and a thermal expansion coefficient approximate to that of said metal. It is most preferable to select the base metal from the group comprising a thin plate or tape of Mo, W, Cu-Mo alloy, Cu-W alloy, Kovar, 42 alloy (42% Ni-Fe) and a clad tape or plate of Kovar sandwiched between copper layers, 42 alloy sandwiched between copper layers, copper sandwiched between 42 alloy layers, etc. so that the required characteristics of thermal expansion and thermal conductivity can be optionally predetermined.

Beside diamond, ceramic materials, such as $Al_2O_3$, AlN, SiC, etc., can be effectively applied to the surface of the base metal. The selection and combination of such materials may be determined in conformity with the requirements of the circuit substrate, the thickness of the film being also optionally controllable.

The ever-increasing demand for semiconductor chips of higher density and greater size can be met by the combination of materials and selection of structural ratio in conformity with the difference of the semiconductor chips and the characteristics required by the semiconductor apparatus by means of compound type substrate of ceramics clad metal as described hereinbefore. Moreover, it is now possible to provide substrate for mounting semiconductor chip of integrated circuit apparatus utilizable also as packaging material of GaAs integrated circuit which is expected to be put to practical use more extensively in the future in addition to the Si integrated circuit.

As the method for coating inorganic material, such as diamond, ceramics, etc., it is preferable to employ the gaseous phase plating method, such as physical vapor deposition method (PVD), chemical vapor deposition method (CVD), etc. When inorganic material is coated with more than two layers, PVD method or CVD method may be employed, or PVD method and CVD method may be employed optionally.

In the invention, the thermal expansion coefficient of the base metal is limited within the range of $3.0 \sim 10.0 \times 10^{-6}$ with the object of approximating it to the thermal expansion coefficient of Si and GaAs thereby enabling to minimize the effect of stress caused by the mismatching of the thermal expansion. Greater importance will be attached to these characteristics in the future according as the size of the semiconductor chip is increased.

In the invention, the thermal conductivity of the base metal is defined above 0.20 cal/cm.sec.°C. with the object of obtaining high thermal conductivity which has never been obtainable by the conventional sintered ceramic substrate material, such as $Al_2O_3$, $2MgO.SiO_2$, etc. This enables to meet the ever-increasing demand for greater radiation of IC.

The thickness of the surface coating is limited within the range of $0.1 \sim 20$ $\mu m$ for the reasons that the required characteristics are not obtainable if below said range, while if above said range, the coating cost is greatly increased thereby impairing the practical utility in respect of economy.

FIG. 2 shows the substrate 13 according to the invention obtained by coating with insulated inorganic material 12 the surface of a metal plate or multi-laminated metal plate 11 having a thermal expansion coefficient approximate to that of the chip. FIG. 4 shows semiconductor apparatus comprising a semiconductor chip 16 mounted on the substrate 13 with interposition of a metallizing layer 14 and Au plating layer 15. FIG. 3 shows a fragmentary sectional structure of tape carrier type IC mounting substrate film according to the invention, wherein fully flexible metal tape (metal foil) 21 is employed instead of organic matter, said metal tape 21 being coated with insulated ceramic film 22 to a thickness of $0.1 \sim 3$ $\mu m$, said ceramic layer being coated with copper film 23 to obtain a triple-laminated structure. The thickness of the metal tape 21 is limited to $0.01 \sim 0.10$ mm since sufficient flexibility is required. The material is selected in conformity with the requirements of the characteristics of thermal expansion and radiation of IC. The effective materials comprise Kovar, 42 alloy (42% Ni-Fe), copper alloys, 42 alloy sandwiched between Cu layers, stainless steel sandwiched between Cu layers, copper sandwiched between 42 alloy layers, etc.

The copper or aluminum film 23 applied over the ceramic coated layer is required to have a thickness of $2 \sim 50$ $\mu m$ which is necessary for the formation of a conductive circuit.

The gaseous phase plating method according to the invention, such as physical vapor deposition method (PVD), chemical vapor deposition method (CVD), etc., is particularly effective for the ceramic and copper or aluminum film in respect of uniform and stabilized adhesion.

The coating of the copper or aluminum film, however, is obtainable by the use of an adhesive or pressure adhesion method.

FIG. 5 is a sectional view showing a second embodiment of the semiconductor apparatus making use of the flat plate-like substrate according to the invention, characterized in that a metal plate 31 having ceramic coating 32 is used for the bottom plate, while $Al_2O_3$ is used for the upper lid 33, thereby enabling to greatly improve the radiation without using a radiation plate. The metal plate used for the bottom plate is required to have high thermal conductivity, a thermal expansion coefficient matching with that of glass and IC, high sealability with glass, and perfect electrical insulation.

As metals having a thermal expansion coefficient matching with that of glass and IC chip, Fe-Ni alloy, Fe-Ni-Cu alloy and Fe-Ni-Co alloy have been known conventionally. However, since the thermal conductivity of these alloys are poorer than that of $Al_2O_3$, these alloys alone are not capable of improving the radiation.

Referring to FIG. 5, the difficulty has been eliminated by the use of a sintered alloy chiefly consisting of Mo. A sintered compact obtained from high purity Mo powder exhibits the same effect. However, when the processability after the improvement of density for the insurance of airtightness is taken into consideration, the cost is inevitably raised to a certain extent. Thus it is industrially preferable to use a sintered alloy chiefly consisting of Mo or W with Fe, Co and Ni added thereto.

A compound plate comprising Fe-Ni alloy having a low thermal expansion coefficient below $10 \times 10^{-6}$ and Cu, Fe having high thermal conductivity can be used as the metal plate in addition to said sintered alloys.

In FIG. 5, the numeral 34 designates semiconductor chip mounted on the ceramic coating layer 32 of the metal plate 21, said chip 34 and spot-shaped Al 37 on lead frames 35,35' being connected by lead wires 38, the lead frames 35,35' being hermetically sealed by sealing glass 36.

FIG. 6 shows a third embodiment of the semiconductor apparatus making use of the tape-shaped substrate according to the invention. Insulated ceramic thin film 42 is formed on metal or compound alloy tape 41, a pattern consisting of metal thin film 44 of Ag, Al, etc. being distributed on the surface of said thin film 42, Si IC chip 43 being secured to one face thereof and bonded to lead pattern by Al thin lead 48, the whole being protected by molding resin 45. The contact terminal 47 of the IC socket is secured through packaging resin 46 and connected with the lead pattern.

In FIG. 7 showing a fourth embodiment making use of the flat plate-shaped substrate according to the invention, conductive circuits 54,55 are formed on flexible metal flat plate 51 on which insulated inorganic thin film 52 is formed by ion-plating method to a thickness of 0.2~5 μm, IC chip 53 being mounted on the conductive circuit pattern 54, the lead circuit 55 and the IC chip 53 being connected by thin lead 57 by means of bonding, the whole being molded by resin mold 56. After the molding process, the end part 51' is subjected to bending to obtain semiconductor package.

This construction enables to utilize the high precision technique of forming printed circuits on the flat plate-shaped substrate without resorting to the punching and etching processes. Since very thin lead pattern can be formed, multi-pin type package of the order of 200 pins is easily producible in the size of the ordinary dual in-line type package.

In case of the conventional lead frame, scattering of the lead pins due to distortion of the substrate makes it impossible to use the automatic bending with stability. According to the invention, however, the lead pins are free from scattering thereby enabling to use automatic bonding with high productivity. Moreover, radiation is very smooth since the lead frame is free from restriction in respect of the configuration of the sectional area.

FIG. 8 is a sectional view showing a fifth embodiment, wherein Fe-Ni alloy plates 63,63' having ceramic insulated coating layers 65,65' are bonded as insulated plates to the obverse and reverse of multi-laminated print substrate 61, the circuits of the base substrate 61 and the circuits on the insulated plates being electrically connected by Ni electrode circuit 64 by way of through hole 67, ceramic chip carrier 62 being soldered to the uppermost surface.

Figure 9:
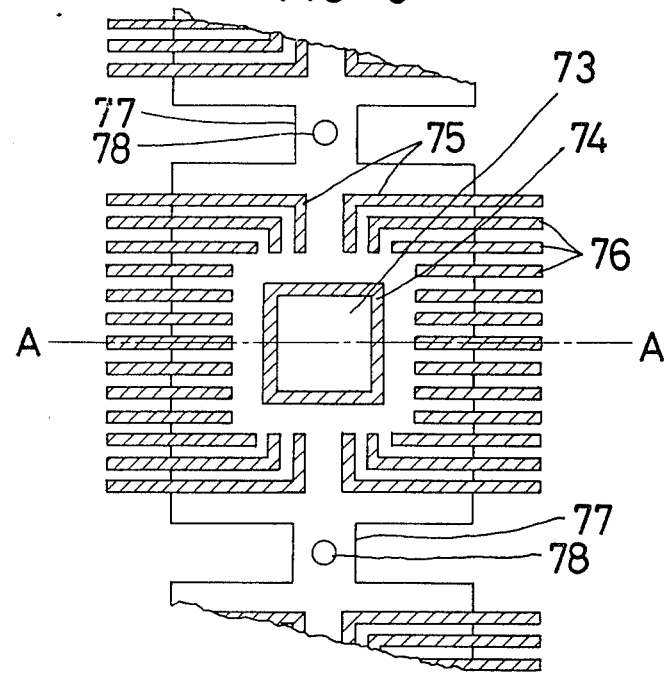
FIG. 9 is a plan view in which the tape coinciding with the outer lead part of the conductive circuit is formed into comb-like shape in the tape-shaped substrate material according to the invention.
Figure 10:
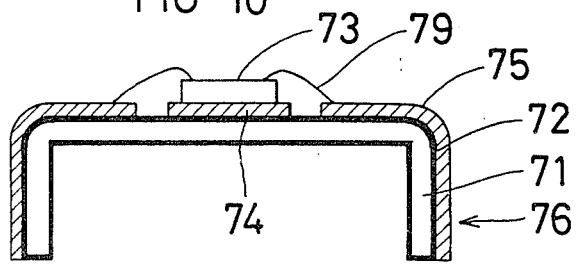
FIG. 10 is a sectional view taken along the line A—A of FIG. 9.

FIGS. 9 and 10 show semiconductor apparatus making use of the tape-shaped substrate according to the invention, wherein the tape coinciding with the outer lead part of the conductive circuit is preliminarily formed into a comb-like shape, on the surface of tape 71 (which may be in the shape of a flat plate) consisting of a metal, alloy, multi-laminated metal or alloy thereof there being formed insulated coating film 72, pat 74 being formed on the semiconductor chip 73 mounting part, while conductive circuit 75 is formed in the electrode lead part, by means of print circuit technique, the metal or alloy tape coinciding with the outer lead part 76 of said conductive circuit 75 being preliminarily formed into a comb-like shape so as to facilitate its mounting on the print substrate.

A metal, such as Al, Cu, Ni, Ag, Au, etc., or such metals in lamination are used for the conductive circuit 75. The mounting method onto the print substrate is optionally selectable from among die bonding, wire bonding 79 and the like.

As shown in FIG. 9, the invention enables to obtain the substrate material in multiple linkage.

To be more precise, a guide hole 78 for positioning is provided in each frame linking part 77 when the metal or alloy for the base metal is formed into the shape of tape of flat plate, thereby enabling to apply the base metal as it stands to the conventional IC assembling process.

According to the invention, since molding resin is not necessitated on the reverse face of the semiconductor chip 8 mounting part as shown in FIGS. 9 and 10, the substrate can be thinned. Moreover, the comb-like shape of the outer lead part no longer necessitates the conventional level difference thereby making it applicable to the flat back type substrate with great advantage.

In addition, since the conductive circuit pattern can be further minimized compared with the conventional lead frame pattern, the multi-pin lead frame can also be further minimized. Thus the substrate material according to the invention is also applicable to QUIP type substrate and chip carrier type substrate.

As described hereinbefore, the invention enables to produce semiconductor apparatus most effective for the greater density, smaller size and improved radiation of IC for which the demand is steadily on the increase by providing substrate consisting of metal plate, flexible metal or multi-laminated metal tape having high thermal conductivity and required thermal expansion characteristics with insulated inorganic film formed thereon, or further coated with copper or aluminum for forming circuits thereon.

The invention will now be described in more detail in reference to the following examples.

EXAMPLE 1

Metal substrate coated with $Al_2O_3$ film for mounting GaAs semiconductor chip was produced by the ionplating method.

Multi-laminated metal plate of 42 alloy sandwiched between copper layers 0.5 mm in thickness was used for the metal substrate with the copper ratio (sectional area ratio) set at 60% in order to obtain a thermal expansion coefficient of $7.0 \times 10^{-6}/°C$.

The ionplating method was applied according to the following process.

$Al_2O_3$ sintered compact used as raw material was evaporated by electronic beam heating. Part of the evaporated matter was ionized by impressing high frequency of 13.56 MHz, 100~200 W, under oxygen pressure of $4 \times 10^{-4}$ Torr. The substrate was coated with $Al_2O_3$ to a thickness of 10.0 μm by heating it at 200° C. to obtain semiconductor chip mounting substrate having improved radiation adhesively coated with transparent insulated film having insulated pressure resistance above 3 Mv/cm and thermal expansion characteristics approximate to those of the mounted GaAs chip.

EXAMPLE 2

Semiconductor mounting substrate comprising same metal plate as in Example 1 coated with $Si_3N_4$ to a thickness of 2 μm by ionplating method was produced. The ionplating was effected by evaporating compressed powder body consisting of $Si_3N_4$ powder by electronic beam heating and by impressing high frequency of 13.56 MHz, 100~200 W, under nitrogen pressure of $4 \times 10^{-4}$ Torr. The substrate was heated at 200° C. to obtain a semiconductor chip mounting substrate having improved radiation adhesively coated with insulated film having insulated pressure resistance over 3 Mv/cm.

EXAMPLE 3

Semiconductor mounting substrate was produced by coating the same substrate as in Example 1 with $2MgO.SiO_2$ to a thickness of 2 μm by spattering method.

The spattering was effected on $2MgO.SiO_2$ sintered compact as target in argon containing 10% oxygen of $1 \times 10^{-2}$ Torr.

The substrate was heated at 200° C. to obtain semiconductor chip mounting substrate having improved radiation adhesively coated with insulated film having insulated pressure resistance over 3 Mv/cm.

EXAMPLE 4

Si semiconductor chip mounting substrate coated with SiC film was produced by plasma CVD method.

The metal substrate was made of Mo 0.5 mm in thickness.

The plasma CVD method was effected with capacity coupling type glow discharger by making use of a mixed gas of $SiH_4$ and $CH_4$ of $1 \times 10^{-2}$ Torr.

The substrate was heated at 500° C. to obtain semiconductor mounting substrate having improved radiation adhesively coated with SiC film to a thickness of 5 $\mu$m having insulated pressure resistance above 3 Mv/cm and thermal expansion coefficient approximate to that of the mounted Si chip.

EXAMPLE 5

A plate of 42 alloy sandwiched between copper layers having a thickness of 0.10 mm was coated with $Al_2O_3$ film to a thickness of 1.0 $\mu$m by ionplating method and then with Cu film to a thickness of 20 $\mu$m by spattering method.

Multi-laminated metal tape was used as substrate with copper ratio (sectional area ratio) set at 60% in order to obtain a thermal expansion coefficient of $7.0 \times 10^{-6}$/°C.

The ionplating method was effected with $Al_2O_3$ sintered compact as raw material. Said sintered compact was evaporated by electronic beam heating with high frequency of 13.56 $MH_z$, 100~200 W, impressed under oxygen pressure of $4 \times 10^{-4}$ Torr thereby ionizing part of the evaporated matter.

The substrate was heated at 200° C. to obtain film coated with $Al_2O_3$ to a thickness of 1.0 $\mu$m and having insulated pressure resistance above 3 Mv/cm, high adhesion and sufficient flexibility. The spattering for forming copper film was effected by heating the substrate in an atmosphere of argon gas at 200° C. with nonoxygenous copper as target.

With the substrate film thus produced, the characteristics were never deteriorated, the coated layer was never exfoliated and the flexibility remained satisfactory even after it was exposed to 200° C. for a long period of time.

EXAMPLE 6

Powders of 0.5 wt %Fe, 0.5 wt %Ni and 1.5 wt %Cu were mixed with Mo powder. The mixture was shaped by a mold $5 \times 18 \times 1$ mm, sintered in hydrogen at 1250° C. for 1 hour, and pressed into substrate metal. The surface of the substrate metal was coated with $Al_2O_3$ by ionplating method to a thickness of 1 $\mu$m.

The conditions were as follows. $Al_2O_3$ sintered compact as a raw material was evaporated by electronic beam heating, and part of the evaporated matter was ionized by impressing high frequency of 13.56 $MH_z$, 100~200 W, under an oxygen pressure of $4 \times 10^{-4}$ Torr.

According to the conventional method for producing CerDIP IC, the substrate thus produced was made into IC package having the construction as shown in FIG. 5 by making use of Al stripe/42 alloy lead frame, PbO-$B_2O_3$ low melting point glass. The package thus obtained had a thermal conductivity of 0.30 cal/cm-.sec.°C., i.e., 4~5 times as high as that of the conventional $Al_2O_3$ substrate. It had satisfactory airtightness because of glass sealing.

EXAMPLE 7

A plate 0.25 mm thick consisting of 42 alloy sandwiched between copper layers was first coated with $Al_2O_3$ film by ionplating method to a thickness of 2 $\mu$m and then with Ni film by spattering method to a thickness of 2 $\mu$m. The Ni film was resisted to a required configuration of lead pattern by screen printing method. Unnecessary Ni was removed by acid bath, and then the resist film was removed. The Ni circuit was coated with Au by nonelectrolytic method to a thickness of 0.3 $\mu$m thereby enabling not only to improve the chip bonding and wire bonding characteristics but also to facilitate mounting of the substrate onto IC socket and print substrate.

Multi-laminated metal tape was used for the substrate, and the copper ratio (sectional area ratio) was set at 60% in order to obtain a thermal expansion coefficient of $7.0 \times 10^{-6}$/°C.

Ionplating for $Al_2O_3$ coating was effected as follows. $Al_2O_3$ sintered compact was evaporated by electronic beam heating, and part of the evaporated matter was ionized by impressing high frequency of 13.56 $MH_z$, 100~200 W, under oxygen pressure of $4 \times 10^{-4}$ Torr. The substrate was coated with $Al_2O_3$ to a thickness of 1.0 $\mu$m by heating it at 200° C. to obtain film having insulated pressure resistance above 3 Mv/cm, high adhesion and sufficient flexibility.

The spattering for forming Ni film was effected with Ni plate having a purity of 99.99% as target. The substrate was heated at 200° C. in an atmosphere of argon gas.

With the IC substrate thus produced, the characteristics were never deteriorated and the coated layer was free from exfoliation even after it was exposed to 200° C. for a long period of time.

EXAMPLE 8

A copper alloy plate 0.1 mm thick was coated with $Al_2O_3$ to a thickness of 0.5 $\mu$m by ionplating method. A 60-pin conductive pattern in SIP (Single In Package) was formed thereon, and further thereon was mounted Si IC. The whole was resin molded as shown in FIG. 7.

Though the substrate was 0.1 mm in thickness, the semiconductor package had sufficient strength and good radiation characteristics, since lead frame IC temperature was reduced from 120° C. to 70° C.

EXAMPLE 9

By the same method as in Example 8, the leg part was bent in the shape of DIP (Dual In-Line Package) into chip carrier type. Thus 128-pin and 160-pin IC packages could be easily produced.

EXAMPLE 10

A copper plate 0.08 mm thick consisting of 42 alloy sandwiched between copper layers was coated with $Al_2O_3$ film to a thickness of 2.0 $\mu$m by ionplating method, and then further coated with aluminum film to a thickness of 3 $\mu$m by ion spattering method.

Multi-laminated metal tape was used for the substrate, and the copper ratio (sectional area ratio) was set at 60% in order to obtain a thermal expansion coefficient of $7.0 \times 10^{-6}$/deg. The ionplating for $Al_2O_3$ coating was effected with $Al_2O_3$ sintered compact used as raw material. The sintered compact was evaporated by electronic beam heating, and part of the evaporated matter was ionized by impressing high frequency of 13.56 MHz, 100~200 W, under oxygen pressure of $4 \times 10^{-4}$ Torr. The substrate was coated with $Al_2O_3$ to a thickness of 1.0 μm by heating it at 200° C. to obtain film having insulated pressure resistance above 3 Mv/cm, high adhesion and sufficient flexibility. The spattering for forming aluminum film was effected with aluminum having a purity of 99.99 wt % as target by heating the substrate at 100° C. in an atmosphere of argon gas. With the substrate film thus produced, the characteristics were never deteriorated, the coated layer was never exfoliated, and the flexibility remained satisfactory even after it was exposed to 200° C. for a long space of time.

EXAMPLE 11

A plate of 42% Ni-Fe 0.25 mm thick was cut into a predetermined configuration of circuit substrate and formed with through holes by a press. The plate was dielectrically coated all over with $Al_2O_3$ to a thickness of 1 μm by PVD method until the inner peripheries of the through holes have been dielectrically coated. On the $Al_2O_3$ coated Fe-Ni plate, circuit formation and through hole plating were effected by means of Ni, and the plate was bonded onto a conventional epoxy multi-laminated print substrate. On the clad print substrate thus produced was mounted a ceramic chip carrier by direct soldering method as shown in FIG. 8. It was found that the substrate was highly effective for this line of use with no occurrence of exfoliation due to different thermal expansion coefficients.

EXAMPLE 12

42% Ni-Fe alloy tape rolled to a thickness of 0.25 mm was pressed into multi-linking lead frame of the shape as shown in FIG. 1. All over said frame was formed $Al_2O_3$ film to a thickness of 1.0 μm by continuously winding type ionplating apparatus, and then Cu, Au double-layer conductive circuit was formed on 26-pin DIP type pattern by screen printing method.

Then semiconductor substrate material was produced by bending the comb-shaped outer lead part of this DIP type pattern.

Resin-mold type IC can be produced by mounting Si chip on the die pat part of said material, effecting thermal compressure wire bonding with Au wire, applying resin mold by potting method, and cutting of the linking sections of the multi-linking frame.

We claim:

1. A substrate for a semiconductor apparatus characterized in that the surface and lateral faces of a metal material or multi-laminated metal material are coated with at least one thin layer of insulative inorganic matter to a thickness of 0.1~20μ by means of a PVD method or CVD method, said metal material or multi-laminated metal material having a thermal expansion coefficient of $3 \sim 10.0 \times 10^{-6}$ cm/cm°C. and/or a thermal conductivity of above 0.2 cal/cm.sec.°C.

2. A substrate for a semiconductor apparatus as defined in claim 1 characterized in that the metal material or multi-laminated metal material is in the shape of a flat plate or tape.

3. A substrate for a semiconductor apparatus as defined in claim 1 wherein the metal material or multi-laminated metal material is selected from the group consisting of Mo, W, a Cu-Mo alloy, a Cu-W alloy, a 29% Ni-17% Co-Fe alloy, a 42% Ni-Fe alloy, an alloy consisting of a 29% Ni-17% Co-Fe alloy sandwiched between copper layers, an alloy consisting of a 42% Ni-Fe alloy sandwiched between copper layers, and an alloy consisting of copper sandwiched between 42% Ni-Fe alloy layers, characterized in that the thermal expansion coefficient thereof is within the range of $3.0 \sim 10.0 \times 10^{-6}$ cm/cm.°C.

4. A substrate for a semiconductor apparatus as defined in claim 1 wherein the metal material or multi-laminated metal material is made principally of a metal selected from the group consisting of Ni, Cu, Al, high thermal conductivity Cu alloys, an alloy consisting of stainless steel sandwiched between copper layers, W and Mo, characterized in that the thermal conductivity thereof is above 0.2 cal/cm.sec.°C.

5. A substrate for a semiconductor apparatus as defined in claim 1 characterized in that the thin layer of inorganic matter is selected from the group consisting of BN, $Al_2O_3$, AlN, SiC, $Si_3N_4$, $Y_2O_3$, $2MgO.SiO_2$ or diamond.

6. A substrate for a semiconductor apparatus characterized in that a flexible metal tape or multi-laminated alloy tape 0.01~0.30 mm thick is coated with insulative inorganic matter to a thickness of 0.1~3μ by means of a PVD method or CVD method, said tape being further coated with a Cu of Al film to a thickness of 2~50μ.

7. A substrate for a semiconductor apparatus as defined in claim 6 wherein the flexible metal tape or multi-laminated alloy tape is selected from the group consisting of 29% Ni-17% Co-Fe, 42% Ni-Fe, copper alloys, an alloy consisting of a 42% Ni-Fe alloy sandwiched between copper layers, an alloy consisting of stainless steel sandwiched between copper layers, and an alloy consisting of copper sandwiched between 42% Ni-Fe alloy layers, characterized in that the thermal expansion coefficient thereof is within the range of $3.0 \sim 10.0 \times 10^{-6}$ cm/cm.°C.

8. A substrate for a semiconductor apparatus as defined in claim 6 wherein the flexible metal tape or multi-laminated alloy tape is made principally of a metal selected from the group consisting of Ni, Cu, Al, high thermal conductivity type Cu alloys, an alloy consisting of stainless steel sandwiched between copper layers, W, and Mo, characterized in that the thermal conductivity thereof is above 0.2 cal/cm. sec.°C.

9. A substrate for a semiconductor apparatus as defined in claim 6 characterized in that the thin film of inorganic matter is at least one material selected from the group consisting of BN, $Al_2O_3$, AlN, SiC, $Si_3N_4$, $Y_2O_3$, $2MgO.SiO_3$ and diamond.

* * * * *